United States Patent
Tashiro et al.

[11] 3,984,845
[45] Oct. 5, 1976

[54] PROJECTING OPTICAL SYSTEM FOR PHOTODRAWING MACHINE

[75] Inventors: Susumu Tashiro, Tokyo; Tetsuo Kamoshita, Toda, both of Japan

[73] Assignee: Asahi Kogaku Kogyo Kabushiki Kaisha, Tokyo, Japan

[22] Filed: Oct. 30, 1974

[21] Appl. No.: 519,256

[30] Foreign Application Priority Data
Oct. 30, 1973   Japan.................. 48-122050[U]

[52] U.S. Cl................................. 354/4; 354/5; 354/270; 350/17; 350/96 R; 350/206
[51] Int. Cl.²................................ G03B 41/00
[58] Field of Search........... 354/4, 5, 76, 270, 40; 355/71; 350/96 R, 17, 206

[56] References Cited
UNITED STATES PATENTS

| | | | |
|---|---|---|---|
| 3,464,330 | 9/1969 | Lewis | 354/4 |
| 3,535,995 | 10/1970 | Ball | 350/206 UX |
| 3,565,524 | 2/1971 | Pabst et al. | 354/76 X |
| 3,595,147 | 7/1971 | Blattner | 354/4 |
| 3,610,119 | 10/1971 | Gerber et al. | 354/4 |

*Primary Examiner*—John Gonzales
*Attorney, Agent, or Firm*—Christie, Parker & Hale

[57] ABSTRACT

An optical system of a photodrawing machine for photo-copying apertures onto light sensitive material minimizes undesirable effects of variations in projecting magnification and in illumination of the image forming plane. Exposure control is effected by a diaphragm mechanism which includes an optical fiber.

3 Claims, 4 Drawing Figures

PROJECTING OPTICAL SYSTEM FOR PHOTODRAWING MACHINE

BACKGROUND OF THE INVENTION

This invention relates to an automatic photodrawing machine and, more particularly, to a projecting optical system which can be mounted on the movable carrier of an automatic photodrawing machine so that, when said movable carrier and drawing plates are stationary, it is operative to photocopy apertures having any desired configurations such as dots, letters, numerals, signs and symbols onto a light sensitive material and, when said movable carrier moves relative to the surfce of said light sensitive material, to draw desired lines on said light sensitive material.

Generally, the thickness of one type of light sensitive material, such as those made in the form of a dry plate, differs from the thickness of other types such as those made in the form of film. Moreover, even as to different samples of light sensitive materials of the same type, there are sample-to-sample variations in thickness. In use of these light sensitive materials it has heretofore been necessary to pay special attention to such variations in thickness.

Nevertheless, most conventional photodrawing machines do not provide any compensation for the displacement of the focal plane caused by the variation in thickness of the light sensitive material being used; instead, drawing operations are carried out under out-of-focus conditions. Even in several conventional photodrawing machines having a focus readjusting capability, the compensation of displacement of the focal plane is effected only by adjusting the projecting lens rather than by displacing the aperture to be projected and the drawing plate. Accordingly, an error is caused in the projecting magnification and hence in the width of lines being drawn. The variation in the projecting magnification also leads to the variation in illumination of the projected point and hence to an undesirable variation in the width of lines being drawn.

As to exposure control, it is conventional in connection with diahragm mechanism to vary opening area thereof in a preselected plane either by operating a diaphragm plate or by screening the light flux with a material having a variable light transmission factor to effect the exposure control. In a photodrawing machine, however, it is not practical to vary the opening area by operting a diahragm plate because no mechanically durable mechanism has heretofore been provided for this purpose. As to the method of screening the light flux with a material having a variable light transmission factor, this could be done in several ways. For example, an optical filter such as optical wedge could be used. As another example, a combination of a polarizing plate and a liquid crystal or crystal such as KDP could be used. However, where an optical filter is used, a difficulty is encountered in maintaining the light transmission at a constant level. On the other hand, the use of a crystal such as KDP involves a difficulty in controlling the incident angle of the light flux, and the use of a liquid crystal involves a difficulty in regard to the response and contact ratio. Thus, all of these conventional methods involves different difficulties and are not very advantageous for use in a high-speed light quantity controlling diaphragm device.

SUMMARY OF THE INVENTION

This invention is directed to eliminating those disadvantages encountered in conventional photodrawing machines, and to providing an improved projecting optical system for use in an automatic photodrawing machine. The projecting optical system includes a light quantity controlling diaphragm mechanism. Preferably, the diaphragm mechanism includes a rotatable hollow cylinder having two diametrically opposed openings. An optical fiber is disposed in the diaphragm mechanism. Advantages of the diaphragm mechanism are that it is mechanically durable and is easily operative to effect exposure control in the course of drawing high quality figures at high speeds. With the projecting optical system of this invention, the illumination of projected light point having a desired configuration can be varied precisely in response to the variation in the drawing speed, so that lines having uniform density and widths can be drawn by exposing the light sensitive material to a constant light.

DETAILED DESCRIPTION

Figure 1:
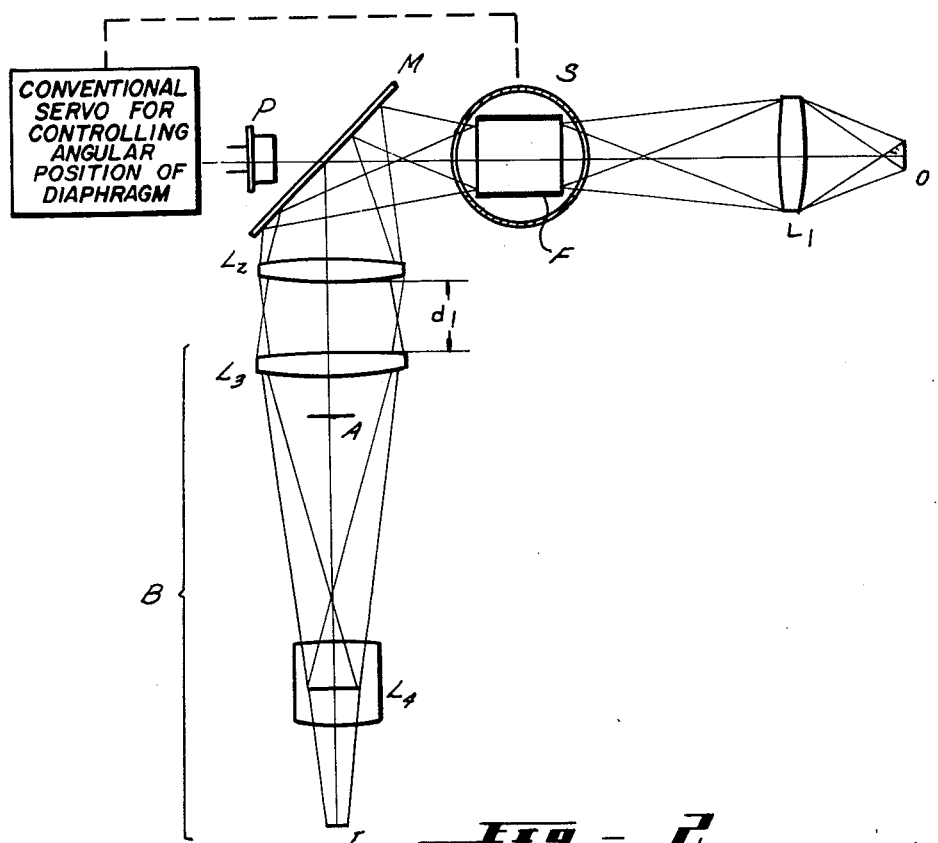
FIG. 1 is an axial sectional view of the projecting optical system according to one embodiment of this invention.

In FIG. 1 a light source O such as an iodine lamp is shown to the right of an illustrating lens $L_l$. Light flux coming from the light source O is transmitted through the lens $L_l$ in a direction toward a beam splitter M. A hollow circular cylindrical diaphgram S is disposed between the lens $L_l$ and the beam splitter M. The diaphragm S has two similar openings at symmetrical positions with respect to the axis of the cylinder. The diaphragm S is rotatable about this axis and provides a diaphragm mechanism section and an operation range controlling mechanism section. When the diaphragm S is rotated around its axis, the diaphragm mechanism section serves to stop-down the light flux passing through the two openings; whereas, the operation range controlling mechanism section is operative to control the operation range of said diaphragm mechanism section so that the latter operates as a light quantity controlling diaphragm. An optical fiber F is fixedly disposed within the hollow circular cylindrical diaphragm S such that the optical axis of the fiber F is aligned with the axis of this diaphgram S. The hollow circular cylindrical diaphragm S and the optical fiber F constitutes a light quantity controlling diaphragm device.

The beam splitter M reflects the major portion of the light flux passing through the diaphragm device and transmits only a small portion thereof. A light receiving element P such as a solar battery is positioned so as to receive and detect the transmitted light. Conventional servo mechanism means shown in block diagram form are preferably provided to respond to the output of the light receiving element P and to cooperate with the diaphragm mechanism in automatically controlling the exposure light quantity. An aperture illuminating lens system comprising adjustably spaced-apart lenses $L_2$ and $L_3$ serves to converge the light flux reflected from the beam splitter M. An aperture A, which is to be projected, is uniformly illuminated by the converged light flux at a high illumination. In the space $d_1$ defined between lenses $L_2$ and $L_3$, the light flux runs almost parallel. A projecting lens $L_4$ is so arranged as to project the aperture A at a desired magnification. Indicated by I is a real image of the aperture A projected by the projecting lens $L_4$ onto the light sensitive material disposed on the drawing plate.

In the foregoing construction, the distance $d_1$ is variable and, in response to such distance variation, a block B consisting of lens $L_3$, aperture A, projecting lens $L_4$ and real image I can be moved up and down without changing the relative position between these elements. The optical fiber F is so arranged that its exit end surface is located substantially in the focal plane of the lens $L_2$. Accordingly, the light flux coming from the optical fiber F becomes almost parallel after it has passed through the lens $L_2$, and enters the lens $L_3$. The lens $L_3$ is so arranged that its focal point is almost coincident with the pupil position of the projecting lens $L_4$, therefore, the real image of the optical fiber F will be formed at the pupil position of the projecting lens $L_4$. This relation is not changed even when the block B moes up and down in response to the variation in the distance $d_1$. Thus, the real image I formed on the image plane is always illuminated uniformly at a constant level and no variation results in the projecting magnification of the real image I. Thus, with the projecting optical system of this invention, the influence of variation in the projecting magnification and the influence of variation in the illumination on the image forming plane over the line width may be minimized simply by moving the block B up and down depending on the thickness of the light sensitive material used. This enables the drawing of figures with lines having constant widths.

The beam splitter M may be disposed not only at a position between the hollow circular cylindrical diaphragm S and lens $L_2$, but also at a position between lenses $L_2$ and $L_3$, at a position between the lens $L_3$ and aperture A to be projected, at a position between said aperture A and projecting lens $L_4$ or at a position between said projecting lens $L_4$ and real image I. It is not essential to design the projecting optical system as shown in FIG. 1 wherein the system is bent at right angles at the beam splitter M; instead, all the elements may be arranged along a straight line. In the latter case, however it will be necessary to select a beam splitter M of an almost transparent type so as thereby to prevent the real image forming light from being unduly reduced in quantity.

To eliminate various disadvantages encountered in the conventional photodrawing machines and to permit a high-speed drawing operation, the hollow circular cylindrical diaphragm S has two similar openings formed in a hollow circular cylinder at symmetrical positions with respect to the axis of the cylinder so that the light flux passing through these openings can be portionally shut off by rotating the hollow circular cylinder around its axis. In accordance with this invention, the hollow circular cylindrical diaphragm S is provided with an optical fiber F disposed therein.

Figure 2:
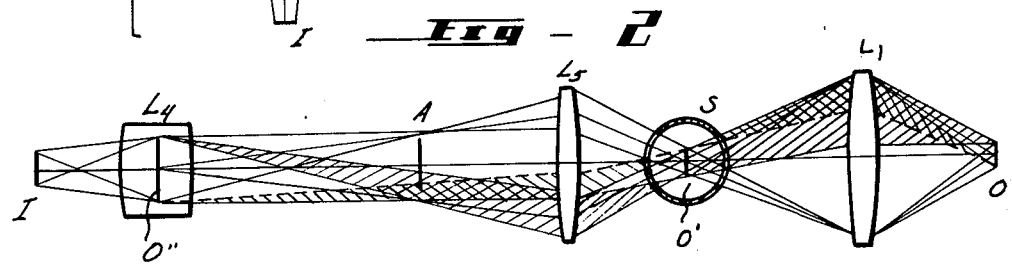
FIG. 2 is an axial sectional vie of a projecting optical system without an optical fiber.

FIG. 2 illustrates a system which does not include an optical fiber. Light flux coming from the light source O is effectively converged by the illuminating lens $L_1$ to form a primary image O′ of the light source O within the hollow circular cylindrical diaphragm S. The light forming the primary image O′ is then transmitted through an aperture illuminating lens $L_5$ (a lens corresponding to the lenses $L_2$ and $L_3$ of FIG. 1) to form a secondary image O″ at the pupil position of the projecting lens $L_4$. As will be seen from FIG. 2, under conditions where the hollow circular cylindrical diaphragm S does not shut off both the incident light and emerging light at all, or when both the openings of the diaphragm S are in essentially symmetrical positions with respect to the optical axis, the aperture A will be illuminated uniformly. When the hollow circular cylindrical diaphragm S is rotated around its axis to partially stop-down the light flux, the balance of the illumination will be shifted and a uniformly distributed illumination will be unattainable. Thus, the light flux will be shut off at the etched areas and the aperture A will have a bright upper portion and dark lower portion.

In a projecting optical system for a photodrawing machine wherein the line width and land width have to be maintained at a high acccuracy, such unevenness in illumination of the aperture A will be a fatal disadvantage. By arranging an optical fiber F within the hollow circular cylindrical diaphragm S, the projecting optical system of this invention can eliminate the unevenness of illumination of the aperture A which might otherwise occur in a shut-off operation. The optical fiber F is so arranged that its optical axis passes through the axis of the hollow circular cylinder. The converging light flux coming onto the incident surface of the optical fiber F is first shut off portionally at the incident opening of the hollow circular cylindrical diaphragm S and, after having passed through the optical fiber F, again shut off portionally at the exit opening.

Figure 3A:
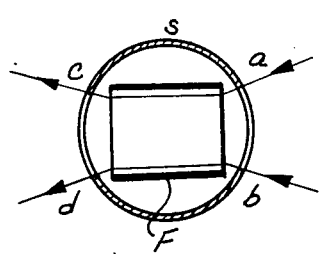
FIGS. 3a and 3b are vertical sectional views of the hollow circular cylindrical diaphragm according to this invention.
Figure 3B:
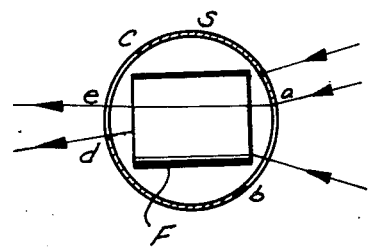

FIGS. 3a and 3b are enlarged views for explaining the operation of the hollow circular cylinder diaphragm S. FIG. 3a illustrates the diaphragm S in the full open position, or in the position where the openings a–b and c–d are in the symmetrical positions with respect to the opticl axis. FIG. 3b illustrates the diaphragm S on a rotated shut-off position where the incident light flux is portionally shut off by the opening edge portion a. The light flux having passed through the optical fiber F is again shut off portionally by the opening edge portion d. Thus, the light flux coming out of the diaphragm S has a cross section corresponding to the opening configuration defined by the virtual opening edge portions e and d. This means that a secondary light source equivalent to the light source O has been formed on the exit surface of the optical fiber F and that the size of such secondary light source can be controlled as desired by operating the diaphragm mechanism.

In summary, the optical fiber F is so arranged that the image of its exit surface is formed in the pupil position of the projecting lens $L_4$ so that the real image of the aperture A can be illuminated uniformly and at any controlled illumination by operating the hollow circular cylindrical diaphragm S. In other words, the exposure control can be effected at a high accuracy by precisely determining the angle of rotation of the hollow circular cylindrical diaphragm in correspondence with the change in the drawing speed. The simple and inexpensive structure of this invention including no abrasive portion is highly durable and has a rapid response. The projecting optical system for a photodrawing machine of this invention is provided with a light quantity controlling diaphragm which can approximate the relation between time and shut-off quantity to any desired functional relation and is operative also as a shutter by giving a wide rotation angle to the hollow circular cylindrical diaphragm S.

What is claimed is:

1. In a photodrawing machine which is provided with a light source, a carrier, and a drawing plate, and is operative, when said carrier and drawing plate are stationary, to photograph apertures of desired configurations on the surface of a light sensitive material disposed on the drawing plate and, when said carrier moves relative to the surface of said light sensitive material, to draw lines, a projecting optical system comprising:

an illuminating lens adapted to converge light flux coming from the light source;

a diaphragm mechanism for controlling said light flux;

an aperture illuminating lens system adapted to converge said light flux coming out of said diaphragm mechanism for thereby illuminating the aperture plane at a high illumination;

a projecting lens arranged behind said aperture illuminating lens system for projecting and photographing said apertures at a desired magnification; and wherein the diaphragm mechanism includes:

an optical fiber defining an optical axis for the light flux passing through the diaphragm mechanism;

a container having the optical fiber disposed therein, the container being rotatable about an axis perpendicular to said optical axis and having two symmetrically arranged opeings which revolve relative to the optical fiber as the container is rotated so as partially to stop down the light flux both before it reaches the optical fiber and again after it has passed therethrough.

2. A projecting optical system according to claim 1, wherein a portion of said aperture illuminating lens system, aperture to be projected and projecting lens are so arranged that they are displaceable relative to the drawing plate while maintaining a constant positional relation between them so as to compensate for the displacement of the focal plane which is caused by variations in thickness of the light sensitive material disposed on the drawing plate; and wherein said illuminating lens system is so arranged that the variation in the exposure light quantity does not influence the compensating operation.

3. A projecting optical system according to claim 1, further comprising a light quantity detecting section which cooperates with the diaphragm mechanism in automatically controlling the exposure light quantity so that lines, of which widths are determined in response to the variation in the drawing speed, can be drawn.

* * * * *

UNITED STATES PATENT AND TRADEMARK OFFICE
CERTIFICATE OF CORRECTION

PATENT NO. : 3,984,845
DATED : October 5, 1976
INVENTOR(S) : Susumu Tashiro & Tetsuo Kamoshita It is certified that error appears in the above-identified patent and that said Letters Patent are hereby corrected as shown below:

Column 1, line 10, "plates" should read -- plate --; line 14, "surfce" should read -- surface -- ; line 44, "diahragm" should read -- diaphragm -- and "mechanism" should read -- mechanisms --; line 51, "operting" should read -- operating --; line 61, after "transmission" insert -- factor --; line 65, "contact" should read -- contrast --; line 66, "involves" should read -- involve --. Column 2, lines 11 and 12, "mechnism" should read -- mechanism --; line 27, "vie" should read -- view --; line 35, "illustrating" should read -- illuminating --; line 38, "diaphgram" should read -- diaphragm --; line 54, "diaphgram" should read -- diaphragm --; line 56, "constitutes" should read -- constitute --. Column 3, line 26, "moes" should read -- moves --. Column 4, line 21, "uneveness" should read --unevenness --; line 25, "uneveness" should read -- unevenness --; line 36, "cylinder" should read -- cylindrical --; line 40 "opticl" should read -- optical -- and "on" should read -- in --. Column 6, line 4, "opeings" should read -- openings --.

Signed and Sealed this

Fourth Day of January 1977

[SEAL]

Attest:

RUTH C. MASON
Attesting Officer

C. MARSHALL DANN
Commissioner of Patents and Trademarks